(12) United States Patent
Hsu et al.

(10) Patent No.: US 6,329,282 B1
(45) Date of Patent: Dec. 11, 2001

(54) METHOD OF IMPROVING THE TEXTURE OF ALUMINUM METALLIZATION FOR TUNGSTEN ETCH BACK PROCESSING

(75) Inventors: Wei-Yung Hsu; Qi-Zhong Hong, both of Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/349,624

(22) Filed: Jul. 8, 1999

Related U.S. Application Data

(60) Provisional application No. 60/099,874, filed on Sep. 11, 1998.

(51) Int. Cl.[7] ............................................... H01L 21/4763
(52) U.S. Cl. .................... 438/625; 438/627; 438/629; 438/635; 438/643; 438/648; 438/653; 438/656; 438/658; 438/672; 438/685; 438/688
(58) Field of Search ............................ 438/625, 627, 438/629, 635, 643, 648, 653, 656, 658, 672, 685, 688

(56) References Cited

U.S. PATENT DOCUMENTS

| | | | |
|---|---|---|---|
| 5,318,924 | * | 6/1994 | Lin et al. .............................. 437/192 |
| 5,780,908 | * | 7/1998 | Sekiguchi et al. .................... 257/383 |
| 6,069,072 | * | 5/2000 | Konecni et al. ...................... 438/642 |
| 6,159,851 | * | 12/2000 | Chen et al. ........................... 438/669 |

\* cited by examiner

*Primary Examiner*—John F. Niebling
*Assistant Examiner*—Lynne Gurley
(74) *Attorney, Agent, or Firm*—Carlton H. Hoel; W. James Brady; Frederick J. Telecky, Jr.

(57) ABSTRACT

A method of making connection between an aluminum or aluminum based material and tungsten. The method includes providing an underlying region containing a layer of tungsten thereover. The underlying region is preferably a layer of titanium over which is a layer of titanium nitride. The layer of tungsten is etched back to the underlying region while exposed tungsten is retained over a portion of the underlying region. The underlying region also may contain a via therein which contains the exposed tungsten. An nitrogen-containing plasma, preferably elemental nitrogen, is then applied to the exposed tungsten and exposed underlying region and a layer of a barrier material is formed by reaction of the nitrogen in the plasma and the tungsten over the exposed tungsten. A further barrier layer, preferably titanium nitride, is optionally then applied followed by a layer of aluminum over the exposed surface, the barrier layer isolating the layer of aluminum from the tungsten. Plasma is preferably an argon/nitrogen plasma.

3 Claims, 1 Drawing Sheet

METHOD OF IMPROVING THE TEXTURE OF ALUMINUM METALLIZATION FOR TUNGSTEN ETCH BACK PROCESSING

This application claims priority under 35 USC §119(e)(1) of provisional application No. 60/099,874 filed Sep. 11, 1998.

BACKGROUND OF THE INVENTION

1. Field of the Invention

This invention relates to a method of improving the texture of aluminum metallization for tungsten etch back processing.

2. Brief Description of the Prior Art

In the fabrication of semiconductor devices, an often required step is that of chemical vapor deposited (CVD) tungsten plug processing wherein a titanium/titanium nitride stack is deposited prior to the CVD tungsten deposition. Etch back is then performed to remove the unwanted tungsten on the field oxide in order to reduce the lead resistance. Aluminum alloy films are then deposited for the leads. Typically, the tungsten etch back is stopped by the titanium nitride layer and a titanium nitride/aluminum/titanium nitride (TiN/Al/TiN) stack is deposited for the lead because better electromigration resistance is observed for this type of stack structure.

It has, however, been observed that there is texture or crystallographic orientation degradation of the TiN/Al/TiN stack when that stack is disposed over an underlying Ti/TiN stack which has gone through the tungsten etch back processing. It is desired that the (111) crystallographic orientation of the aluminum be, to the greatest possible extent, normal to the surface of the aluminum layer. For example, without etch back, the TiN/Al/TiN stack can have the texture of aluminum with (111) crystallographic orientation (Al (111)) texture of about 1.4 degrees for x-ray rocking curve full-width-at half-maximum (FEWM). However, after etch back, the FWHM dropped to about 3.5 degrees. This change is attributed to the damage to the TiN surface due to the tungsten etch back processing prior to the deposition of the aluminum.

Aluminum with (111) texture in a direction normal to the surface of the aluminum layer is most beneficial for electromigration improvements. The texture is controlled by the deposition conditions and, most profoundly, by the substrates (e.g. aluminum films can develop strong (111) texture when titanium is used beneath the aluminum). However, to prevent interaction between the aluminum and the titanium, it is necessary to form a layer of titanium nitride or other barrier material between the aluminum and the titanium. Also, the titanium nitride layer can prevent the reaction between tungsten hexafluoride ($WF_6$) (generally used for tungsten plug filling) and titanium. Fortunately, titanium nitride has an atomic arrangement similar to that of aluminum (111) and titanium (0001). Therefore, by controlling the orientation of the titanium, the texture of the titanium can be transferred to the titanium nitride and then to the aluminum.

In accordance with standard fabrication techniques there is provided a substrate having a metal layer and an oxide layer thereon with the oxide layer extending over the metal layer and having a via extending therethrough to the metal layer, such as, for example, silicon dioxide on silicon. A layer of titanium is deposited over the oxide layer including the interior walls of the via and a titanium nitride layer is deposited over the entire layer of titanium including the interior walls of the via. Tungsten is then deposited over entire surface to cover the titanium nitride layer, fill the via. The tungsten layer is thereby separated from the oxide layer by the titanium and the layer of titanium nitride. The tungsten layer is then etched back using an appropriate etchant, preferably $SF_6$ as the etchant, with the titanium nitride layer acting as an etch stop so that the tungsten remains only within the via. As a result of this etch back of tungsten step, a degree of contamination remains on the surface of the titanium nitride layer and exposed tungsten within the via in the form of elemental sulfur, fluorine and possibly other contaminants. Accordingly, when an aluminum interconnect layer is then deposited over the exposed titanium nitride and tungsten within the via, due to the contamination, very little of the aluminum will have the desired (111) crystallographic orientation normal to the surface of the aluminum. As described above, it is highly desirable to have as much of the aluminum as possible having the (111) crystallographic orientation normal to the surface of the aluminum. Accordingly, a solution to this problem is highly desirable.

SUMMARY OF THE INVENTION

In accordance with the present invention, the texture of the titanium nitride layer and the aluminum is improved relative to the prior art, thereby providing a much high degree of aluminum with (111) crystallographic orientation relative to the surface of the aluminum layer than was obtained in the prior art.

Briefly, the CVD tungsten is deposited to fill the via or contact and the etch back of the tungsten, preferably using $SF_6$, to remove the tungsten on the field oxide and over and external to the via proceeds as in the prior art with tungsten remaining in the vias with the etch back process controlled with end point detection such that the etch is stopped at the titanium nitride layer. A slight over etch is required to remove unetched tungsten nodules on the field.

At this point, in accordance with the present invention, an in-situ plasma, preferably an argon/nitrogen plasma (though other plasmas can be used such as, for example, nitrogen, nitrogen/hydrogen, nitrogen/ammonia and combinations thereof), is used to remove the residual contaminants, such as, for example, sulfur and fluorine and any other contaminants on the titanium nitride surface when an $SF_6$ etchant is used. The addition of nitrogen to the plasma also assists in passivation of the tungsten surface with the formation of tungsten nitride which prevents reaction between the aluminum and the tungsten. A dramatic improvement was shown with this passivation processing to prevent the reaction between the aluminum and the tungsten even after annealing at 500° C. for 2.5 hours. Annealing generally takes place in a multilevel metallization process after completion of all other processing steps and generally at a temperature of from about 400 to about 500 degrees C.

A TiN/Al/TiN stack is then deposited on the undamaged and passivated TiN surface, it being understood that the first TiN layer can but need not be eliminated in view of the formation of the tungsten nitride layer over the exposed tungsten as described above. Hyper-textured aluminum was obtained with this cleaning and passivation process. It should be understood that in all cases wherein aluminum is used, an appropriate aluminum based alloy can be substituted therefore.

DESCRIPTION OF THE PREFERRED EMBODIMENT

Figure 1A:
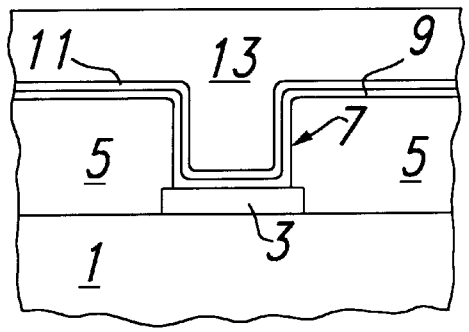
FIGS. 1a and 1b set forth a portion of the process flow in accordance with the prior art and the present invention.
Figure 1B:
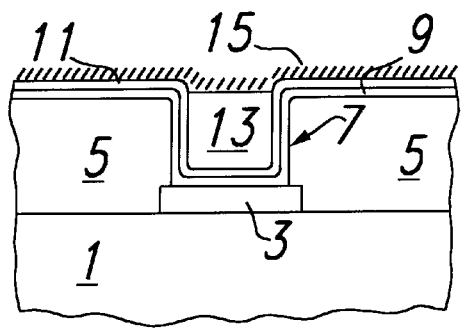

Referring first to FIGS. 1a and 1b, there is shown a typical prior art procedure for filling of vias and providing an interconnect to the via. With reference first to FIG. 1a, there is shown a substrate 1 having a metal layer 3 and an oxide layer 5 thereon with the oxide layer extending over the metal layer and having a via 7 extending therethrough to the metal layer 3. A layer of titanium 9 is deposited over the oxide layer 5 including the interior walls of the via 7 and a titanium nitride layer 11 is deposited over the entire layer of titanium including the interior walls of the via. Tungsten 13 is then deposited over the titanium nitride layer 11 to fill the via 7 and provide a planar layer of tungsten over the oxide layer 5 and separated from the oxide layer by the titanium 9 and the layer of titanium nitride 11. The tungsten layer is then etched back using $SF_6$ as the etchant with the titanium nitride layer 11 acting as an etch stop so that the tungsten 13 remains only within the via 7 as shown in FIG. 1b. As a result of this step, a degree of contamination 15 remains on the surface of the titanium nitride layer 11 and exposed tungsten 13 in the form of elemental sulfur, fluorine and tungsten, the latter over the titanium nitride layer. Accordingly, when an aluminum interconnect (not shown) is then deposited over the exposed titanium nitride and tungsten, due to the contamination 15, very little of the aluminum will have the desired (111) crystallographic orientation normal to the surface of the aluminum. As described above, it is highly desirable to have as much of the aluminum as possible having the (111) crystallographic orientation normal to the surface of the aluminum.

In accordance with the present invention, the prior art procedures are altered by providing, after the $SF_6$ etch back of the prior art as shown in FIG. 1b, an in-situ argon/nitrogen plasma at 200 watts and 0.6 Torr to remove the residual sulfur, fluorine and other contaminants 15 on the surface of the titanium nitride layer 11. The addition of the nitrogen to the plasma helps to passivate the surface of the tungsten 13 with the formation of tungsten nitride. A titanium nitride 17/aluminum 19/titanium nitride 21 stack was then deposited on the undamaged and passivated titanium nitride surface 11 and tungsten 13. As the tungsten surface is passivated with the nitrogen-containing plasma, the thickness of the bottom titanium nitride in the TiN/Al/TiN stack can be reduced. This reduction in metal stack height reduces the line-to-line capacitance and thus results in lower RC delay and high device speed.

A dramatic improvement was observed with this passivation processing to prevent the reaction between aluminum and tungsten and after removal of the contaminants, even after annealing at 500° C. for 2.5 hours. Without passivation, the pre-annealing sheet resistance was measured at 44 mohms/square and at 86 mohms/square after annealing. With passivation, the pre-annealing sheet resistance was measured at 44 mohms/square and at 45 mohms/square after annealing. Hyper-textured aluminum was obtained with this cleaning and passivation process wherein the x-ray rocking curve FWHM in degrees was measured at 3.8 without passivation and at 1.5 with passivation.

Figure 2A:
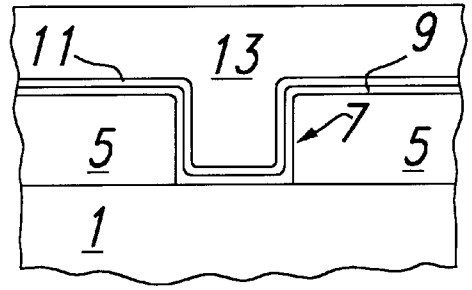
FIGS. 2a and 2b set forth a portion of the process flow in accordance with the prior art and a second embodiment in accordance with the present invention.
Figure 2B:
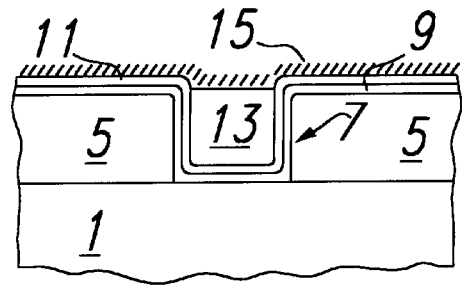
Figure 1C:
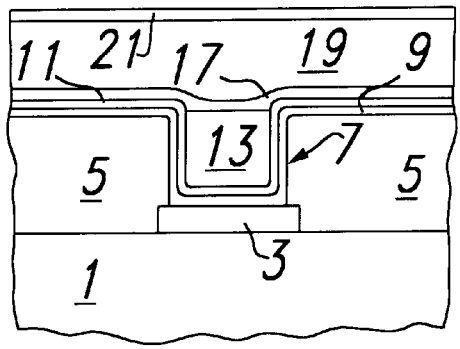
FIG. 1c sets forth the completion of the process flow in accordance with the present invention.
Figure 2C:
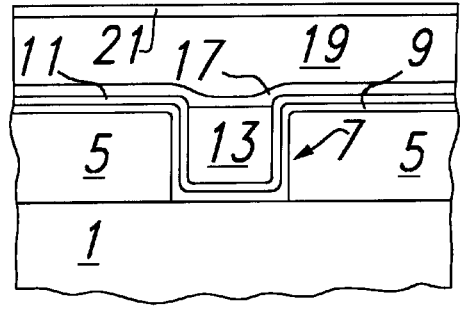
FIG. 2c set forth the completion of the process flow in accordance with the second embodiment in accordance with the present invention.

Referring to FIGS. 2a and 2b, wherein like reference numbers depict the same or similar structure to the structure of FIGS. 1a to 1c, there is shown a typical prior art procedure for filling of contacts and providing an interconnect to the contacts. With reference first to FIG. 2a, there is shown a substrate 1 having an oxide layer 5 thereon and having a contact 7 extending therethrough to the substrate 1. A layer of titanium 9 is deposited over the oxide layer 5 including the interior walls of the contact 7 and a titanium nitride layer 11 is deposited over the entire layer of titanium including the interior walls of the contact. Tungsten 13 is then deposited over the titanium nitride layer 11 to fill the contact 7 and provide a planar layer of tungsten over the oxide layer 5 and separated from the oxide layer by the titanium 9 and the layer of titanium nitride 11. The tungsten 13 layer is then etched back using $SF_6$ as the etchant with the titanium nitride layer 11 acting as an etch stop so that the tungsten 13 remains only within the contact 7 as shown in FIG. 2b. As a result of this step, a degree of contamination 15 remains on the surface of the titanium nitride layer 11 and exposed tungsten 13 in the form of elemental sulfur, fluorine and tungsten, the latter over the titanium nitride layer. Accordingly, when an aluminum interconnect (not shown) is then deposited over the exposed titanium nitride and tungsten, due to the contamination 15, very little of the aluminum will have the desired (111) crystallographic orientation normal to the surface of the aluminum. In accordance with the present invention, after the $SF_6$ etch back of the prior art as shown in FIG. 2b, an in-situ argon/nitrogen plasma as set forth above or a nitrogen plasma, or a nitrogen/hydrogen plasma or a nitrogen/ammonia plasma or combination of these plasmas is applied to remove the residual sulfur, fluorine and other contaminants 15 and passivate the exposed tungsten surface. A titanium nitride 17/aluminum 19/titanium nitride 21 stack is then deposited on the undamaged and passivated titanium nitride surface 11 and tungsten surface 13 as shown in FIG. 2c. Improved aluminum texture is thus obtained. As an alternative, an ex-situ passivation can be performed with an elemental nitrogen-containing plasma prior to titanium 17/aluminum 19/titanium nitride 21 stack deposition.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of aluminum crystal orientation control, comprising:
    (a) providing a surface including a first portion consisting essentially of tungsten and a second portion consisting essentially of titanium nitride;
    (b) exposing said surface to a nitrogen-containing plasma;
    (c) forming an aluminum layer over the surface;
    (d) whereby the exposing of step (b) removes contaminants and thereby controls the crystal orientation of the aluminum over both the tungsten and the titanium nitride.

2. The method of claim 1, further comprising:
    (a) forming a barrier layer on the surface after the exposing of step (b) of claim 1; and
    (b) the forming an aluminum layer of step (c) of claim 1 is depositing aluminum on the barrier layer.

3. The method of claim 2, wherein:
    (a) the barrier layer is titanium nitride.

* * * * *